United States Patent
Eom et al.

(10) Patent No.: US 7,186,280 B2
(45) Date of Patent: Mar. 6, 2007

(54) METHOD OF INSPECTING A LEAKAGE CURRENT CHARACTERISTIC OF A DIELECTRIC LAYER AND APPARATUS FOR PERFORMING THE METHOD

(75) Inventors: Tae-Min Eom, Seoul (KR); Chung-Sam Jun, Suwon-si (KR); Yu-Sin Yang, Seoul (KR); Yun-Jung Jee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/175,363

(22) Filed: Jul. 7, 2005

(65) Prior Publication Data
US 2006/0022698 A1 Feb. 2, 2006

(30) Foreign Application Priority Data
Jul. 15, 2004 (KR) ........................ 10-2004-0055062

(51) Int. Cl.
*H01L 21/00* (2006.01)
*H01L 21/66* (2006.01)

(52) U.S. Cl. .................... 29/25.01; 438/14; 438/15; 438/17; 438/18; 257/E21.521; 257/E21.524

(58) Field of Classification Search ................ 257/48, 257/E23.179, 21.521, E21.524; 438/18, 438/14, 15, 17; 347/128, 123; 324/765
See application file for complete search history.

(56) References Cited

U.S. PATENT DOCUMENTS

| | | | | |
|---|---|---|---|---|
| 4,812,756 A | * | 3/1989 | Curtis et al. ................ 324/750 |
| 5,216,362 A | * | 6/1993 | Verkuil ....................... 324/767 |
| 6,104,206 A | | 8/2000 | Verkuil |
| 6,207,468 B1 | * | 3/2001 | Chacon et al. ................ 438/17 |
| 6,251,697 B1 | * | 6/2001 | Chacon et al. ................ 438/17 |
| 6,255,128 B1 | | 7/2001 | Chacon et al. |
| 6,522,158 B1 | * | 2/2003 | Fung et al. .................. 324/765 |
| 6,538,462 B1 | | 3/2003 | Lagowski et al. |
| 6,597,193 B2 | | 7/2003 | Lagowski et al. |
| 6,680,621 B2 | * | 1/2004 | Savtchouk et al. .......... 324/765 |
| 6,759,255 B2 | * | 7/2004 | Xu et al. ....................... 438/14 |
| 6,771,091 B2 | * | 8/2004 | Lagowski et al. ........... 324/765 |
| 6,771,092 B1 | * | 8/2004 | Fung et al. .................. 324/765 |
| 6,937,050 B1 | * | 8/2005 | Fung et al. .................. 324/765 |
| 2002/0121914 A1 | * | 9/2002 | Chacon et al. .............. 324/765 |
| 2002/0125900 A1 | * | 9/2002 | Savtchouk et al. .......... 324/750 |
| 2004/0057497 A1 | * | 3/2004 | Lagowski et al. ........... 374/163 |

* cited by examiner

*Primary Examiner*—Michelle Estrada
*Assistant Examiner*—Jarrett J. Stark
(74) *Attorney, Agent, or Firm*—Lee & Morse, P.C.

(57) ABSTRACT

A method of inspecting a leakage current of a dielectric layer on a substrate including a cell array region having a plurality of cell blocks including a patterned structure, the dielectric layer formed on the patterned structure, and a peripheral circuit region includes depositing a corona ion charge on a cell block selected from the plurality of cell blocks and measuring a variance of a surface voltage caused by a leakage current through the dielectric layer on the selected cell block. The variance of the surface voltage is compared with reference data to determine a leakage current characteristic of the dielectric layer.

17 Claims, 7 Drawing Sheets

METHOD OF INSPECTING A LEAKAGE CURRENT CHARACTERISTIC OF A DIELECTRIC LAYER AND APPARATUS FOR PERFORMING THE METHOD

BACKGROUND OF THE INVENTION

1. Field of the Invention

The present invention relates to a method of inspecting a leakage current characteristic of a dielectric layer and an apparatus for performing the method. More particularly, the present invention relates to a method of inspecting a leakage current characteristic of a dielectric layer on a semiconductor substrate using corona ion charges, and an apparatus for inspecting a leakage current characteristic of a dielectric layer using the method.

2. Description of the Related Art

Recently, as semiconductor devices have become highly integrated and have also been operating at higher speeds, areas of memory cell regions in the semiconductor devices have been reduced. Thus, areas of regions in which a transistor and a capacitor in which each of the cells are formed have been reduced. In such highly integrated semiconductor devices, characteristics of a dielectric layer, e.g., a breakdown voltage characteristic, a leakage current characteristic, etc., deteriorate due to the reduction in area of a memory cell region.

In particular, the leakage current characteristic of the dielectric layer is deteriorated by contaminants at an interface between the dielectric layer and a semiconductor substrate. Also, the leakage current characteristic of the dielectric layer varies in accordance with step coverage of a patterned structure on the semiconductor substrate.

There are several conventional methods of inspecting a leakage current characteristic of a dielectric layer. One method measures a leakage current of a PN junction using a corona charger and a Kelvin probe. Another method measures a surface voltage using a Kelvin probe in which impurities on a semiconductor substrate having an interface between the semiconductor substrate and a dielectric layer are recognized. Still another method measures a stress-induced leakage current (SILC) and a gate dielectric integrity or gate oxide integrity (GOI) using a corona discharge.

In the above-mentioned conventional methods, after a dielectric layer is formed on a sample semiconductor substrate, a leakage current characteristic of the dielectric layer is inspected. A leakage current characteristic of a dielectric layer on a patterned semiconductor substrate is not determined based on the leakage current characteristic of the dielectric layer on the sample semiconductor substrate. That is, it is difficult to measure the leakage current characteristic of the dielectric layer on the patterned semiconductor substrate due to the step coverage of the dielectric layer on the patterned semiconductor substrate.

Also, since an area of a measurement region is large, characteristics of the dielectric layer are not minutely managed. For example, measuring the leakage current of the dielectric layer is performed on dies of the semiconductor substrate. Thus, the ability to accurately measure the leakage current of the dielectric layer with respect to various regions in each of the dies is needed.

SUMMARY OF THE INVENTION

The present invention is therefore directed to a method and apparatus for inspecting a leakage current characteristic of a dielectric layer, which substantially overcome one or more of the problems due to the limitations and disadvantages of the related art.

It is a feature of an embodiment of the present invention to provide a method of inspecting a leakage current characteristic of a dielectric layer that is formed on each cell block or on selected cell blocks.

It is another feature of an embodiment of the present invention to provide a method of inspecting the leakage current characteristic of the dielectric layer formed on each of cell blocks in the cell array region so that the characteristics of the dielectric layer may be managed relatively closely.

It is yet another feature of an embodiment of the present invention to provide a method of inspecting the leakage current characteristics of the dielectric layer having an improved reliability due to various comparisons between the reference data and the measurement data.

It is still another feature of the present invention to provide an apparatus for performing any of the above-mentioned methods.

At least one of the above and other features and advantages of the present invention may be realized by providing a method of inspecting a leakage current characteristic of a dielectric layer on a substrate having a cell array region that includes a patterned structure, a plurality of cell blocks formed on the patterned structure and a peripheral circuit region, the method including depositing a corona ion charge on a cell block selected from the plurality of cell blocks, measuring a variance of a surface voltage caused by a leakage current through the dielectric layer on the selected cell block on which the corona ion charge is deposited, and comparing the measured variance of the surface voltage with reference data to determine the leakage current characteristic of the dielectric layer.

The method may include, before depositing the corona ion charge, obtaining an image of the substrate; and aligning a corona charger for generating the corona ion charge with the selected cell block based on the image. The method may include, before depositing the corona ion charge, pre-aligning the substrate on the basis of a notch in the substrate The method may include aligning a probe for measuring the variance of the surface voltage on the selected cell block based on the image. The measuring the variance of the surface voltage may include providing a probe having a size corresponding to that of the selected cell block, and aligning the probe with the selected cell block. The probe may be selected from a plurality of probes having different sizes and/or different shapes.

The reference data may include reference spectra representing variances of reference surface voltages obtained from different reference dielectric layers. The determining the leakage current characteristic may include comparing the reference spectra with a measurement spectrum representing the measured variance of the surface voltage.

The reference data may include a reference spectrum representing a variance of a reference surface voltage obtained from a reference dielectric layer. The determining the leakage current characteristic may include comparing an initial reference voltage of the reference spectrum with an initial measurement voltage obtained from a measurement spectrum representing the measured variance of the surface voltage, comparing a voltage drop rate of the reference spectrum with a voltage drop rate of the measurement spectrum and/or comparing a steady-state voltage of the reference spectrum with a steady-state voltage of the measurement spectrum.

At least one of the above and other features and advantages of the present invention may be realized by providing an apparatus for inspecting a leakage current characteristic of a dielectric layer on a substrate having a cell array region that includes a patterned structure, a plurality of cell blocks on the patterned structure and a peripheral circuit region, the apparatus including a corona charger adapted to deposit a corona ion charge on a cell block selected from among a plurality of cell blocks, a probe unit for measuring a variance of a surface voltage caused by a leakage current through the dielectric layer on the selected cell block, and a data-processing unit for comparing the measured variance of the surface voltage with reference data to determine the leakage current characteristic of the dielectric layer.

The apparatus may include an image-obtaining unit for obtaining an image of the substrate, a stage adapted to support the substrate, a driving unit for moving the stage, the corona charger and the probe unit relative to one another, and a driving controller for controlling operations of the driving unit to align the selected cell block with a selected probe from the plurality of probes or the corona charger. The probe unit may include a plurality of probes having different sizes and/or shapes. The selected probe may include a pick-up plate having a diameter corresponding to a width of the selected cell block and/or a shape corresponding to that of the selected cell block, and a vibrator for vibrating the pick-up plate.

The probe unit may include a common support for supporting the plurality of probes. The probes may be arranged in a radial direction with respect to a center of the common support. A rotating supporter may be provided for the probe unit. A probe controller may select a probe having a size and/or shape matched to that of the selected cell block from the plurality of probes.

The apparatus may include an image-obtaining unit for obtaining an image of the substrate, a driving unit, and a driving controller for selecting a selected probe from the plurality of probes matching a size and/or shape of the selected cell block, and controlling operation of the driving unit to align the selected probe or the corona charger with the selected cell block.

The reference data may include reference spectra representing variances of reference surface voltages obtained from different reference dielectric layers. The data-processing unit may include a comparator for comparing the reference spectra with a measurement spectrum representing the measured variance of the surface voltage and a calculator for calculating values of the leakage current characteristic of the dielectric layer in accordance with comparison results of the comparator.

The reference data may include a reference spectrum representing a variance of a reference surface voltage obtained from a reference dielectric layer. The data-processing unit may include a comparator for comparing an initial reference voltage of the reference spectrum with an initial measurement voltage of a measurement spectrum representing the measured variance of the surface voltage, a voltage drop rate of the reference spectrum with a voltage drop rate of the measurement spectrum and/or a steady-state voltage of the reference spectrum with a steady-state voltage of the measurement spectrum. The data-processing unit may include a calculator for calculating values of the leakage current characteristic of the dielectric layer in accordance with comparison results of the comparator.

The apparatus may include a pre-aligning unit for preliminarily aligning the substrate on the basis of a notch in the substrate.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2004-55062, filed on Jul. 15, 2004, in the Korean Intellectual Property Office, and entitled: "Method of Inspecting a Leakage Current Characteristic of a Dielectric Layer and Apparatus for Performing the Method," is incorporated by reference herein in its entirety.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
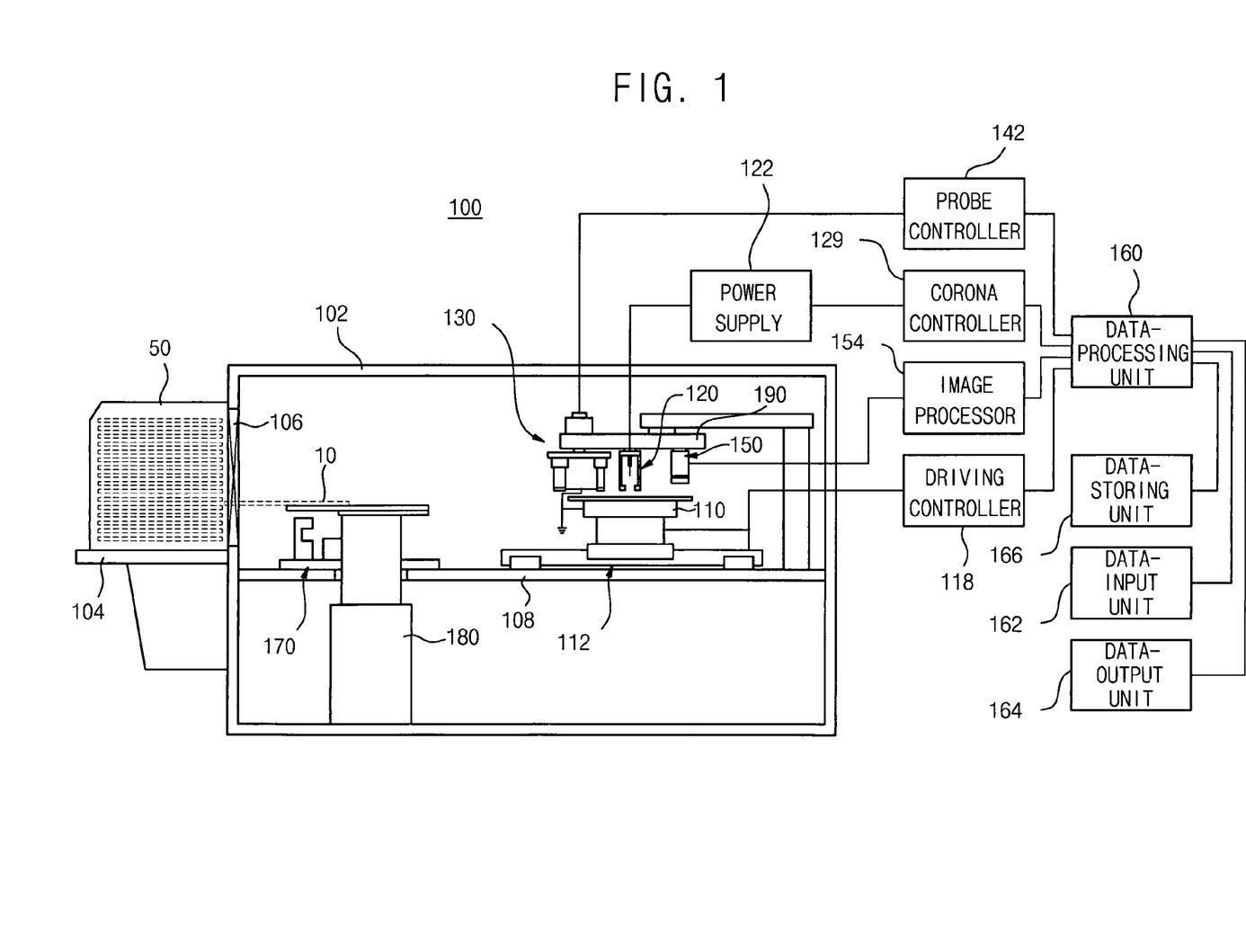
FIG. 1 illustrates a schematic view of an apparatus for inspecting a leakage current characteristic of a dielectric layer in accordance with an embodiment of the present invention.
Figure 2:
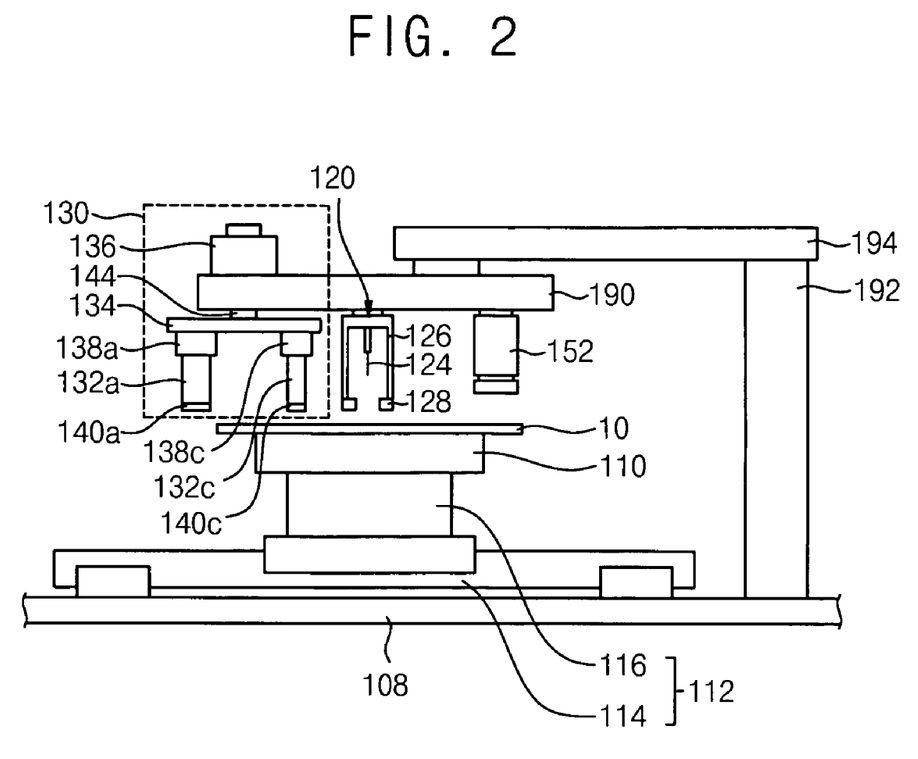
FIG. 2 illustrates an enlarged view of a corona charger and a probe unit in FIG. 1.
Figure 3:
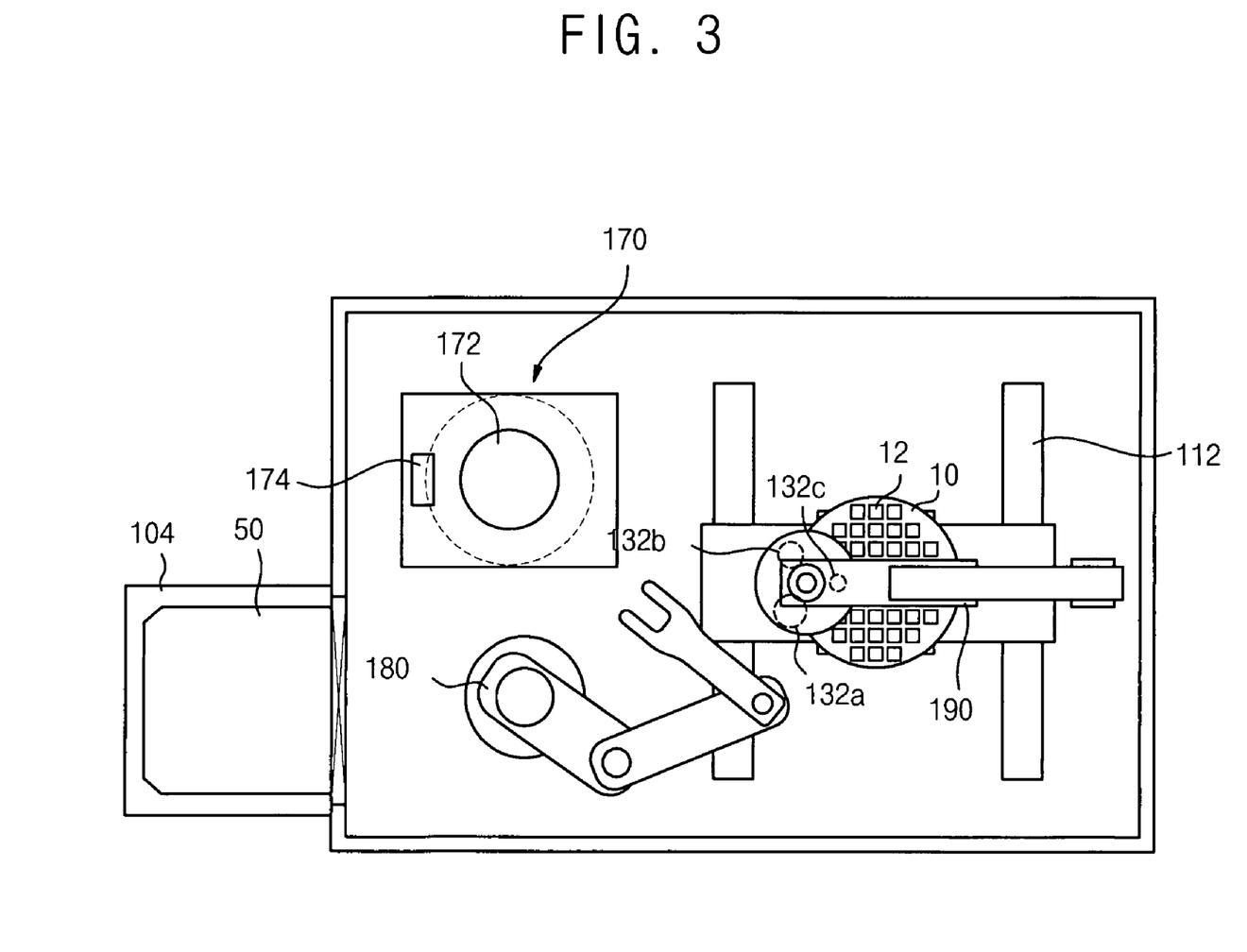
FIG. 3 illustrates a plan view of the apparatus in FIG. 1.

FIG. 1 illustrates a schematic view of an apparatus for inspecting a leakage current characteristic of a dielectric layer in accordance with an embodiment of the present invention, FIG. 2 illustrates an enlarged view of a corona charger and a probe unit in FIG. 1, and FIG. 3 illustrates a plan view of the apparatus in FIG. 1.

Referring to FIGS. 1 to 3, an apparatus 100 in accordance with an embodiment the present invention includes an inspection chamber 102 for performing an inspection with respect to a leakage current characteristic of a dielectric layer, a stage 110 for supporting a semiconductor substrate 10, e.g., a silicon wafer, a driving unit 112 for moving the stage 110, a corona charger 120 for generating a corona ion charge that is deposited on the semiconductor substrate 10, a probe unit 130 for inspecting the leakage current characteristic of the dielectric layer on the semiconductor substrate 10, an image-obtaining unit 150 for obtaining an image of the semiconductor substrate 10, a supporter 190 for supporting the image-obtaining unit 150, a pre-aligning unit 170 for pre-aligning the semiconductor substrate 10, and a robot 180 for transferring the semiconductor substrate 10.

The inspection chamber 102 includes a support plate 104, which extends from a sidewall of the inspection chamber 102, for supporting a vessel 50 that receives a plurality of semiconductor substrates 10 therein, a door 106 through which the semiconductor substrates 10 pass and a base plate 108 horizontally arranged in the inspection chamber 102.

The apparatus 100 also includes a data-processing unit 160, which is coupled to a driving controller 118, a corona controller 129, a probe controller 142 and an image processor 154. The data-processing unit 160 is also coupled to a data-input unit 162, a data-output unit 164 and a data-storing unit 166. The driving controller 118 controls the driving unit 112. The corona controller 129 controls a power supply 122 for supplying power to the corona charger 120. The probe controller 142 controls the probe unit 130. Images from the image obtaining unit 150 are output to the image processor 154.

The driving unit 112 is arranged over the base plate 108 and connected to a lower portion of the stage 110. The driving unit 112, shown in detail in FIG. 2, includes a first driver 114, for moving the stage 110 in a horizontal direction, and a second driver 116, for moving the stage 110 in a vertical direction. The driving unit 112 is coupled to the driving controller 118, which controls operation of the driving unit 112 via a signal line. The first driver 114 may be a perpendicular coordinate type robot and the second driver 116 may be a hydraulic or pneumatic cylinder.

The stage 110 may hold the semiconductor substrate 10 using vacuum. The stage 110 may be coupled to a ground potential. In this case, the semiconductor substrate 10 on the stage 110 is electrically connected to the ground potential.

The corona charger 120, the probe unit 130 and the supporter 190 may be positioned over the stage 110. The supporter 190, shown in detail in FIG. 2, may include a vertical arm 192 on the base plate 108 and a horizontal arm 194 horizontally extending from an upper portion of the vertical arm 192.

The corona charger 120, shown in detail in FIG. 2, may include a corona emitter 124 connected to the power supply 122, a housing 126 housing the corona emitter 124 and a corona-defining ring 128 fixed to the housing 126. The corona-defining ring 128 defines a region of the semiconductor substrate 10 in which the corona ion charge is to be deposited. The corona emitter 124 may include a needle having tungsten carbide. The corona-defining ring 128 may include a metal. A voltage of about ±8,000V may be applied to the corona emitter 124 from the power supply 122. The corona-defining ring 128 may be electrically connected to the ground potential. The corona-defining ring 128 may have an inner diameter of about hundreds of micrometers to about several millimeters. The corona-defining ring 128 may vary in accordance with a size of a region to be inspected.

The probe unit 130, shown in detail in FIGS. 2 and 3, may include a plurality of probes 132a, 132b, 132c having different sizes, a circular disk 134 for supporting the probes and a rotary driver 136 for rotating the circular disk 134. The probes 132a–132c may be arranged in a radial direction with respect to a center of the circular disk 134. The circular disk 134 may be positioned under the supporter 190. The rotary driver 136 may be arranged on the supporter 190. A rotational shaft 144 may be connected between the circular disk 134 and the rotary driver 136 via the supporter 190.

An example of a probe includes a Kelvin probe. Each of the probes 132a to 132c may include a capacitive pick-up plate 140a–140c, connected to a vibrator 138a–138c, respectively, to sense an electrical potential on the semiconductor substrate 10. The vibrators 138a–c may be mounted beneath the circular disk 134. In the particular example shown in FIGS. 2 and 3, there are three probes, 132a, 132b and 132c, though any desired number may be provided.

The image-obtaining unit 150 obtains the image of the semiconductor substrate 10 on the stage 110. The image-obtaining unit 150 includes an imager 152 outputting an image of the semiconductor substrate 10 to the image processor 154 for creating the image data by processing the image of the semiconductor substrate 10. The imager 152 may be any conventional device, e.g., an optical microscope, a charge coupled device (CCD) camera, etc.

The pre-aligning unit 170 for preliminarily aligning the semiconductor substrate 10 may be arranged over the base plate 108. The pre-aligning unit 170, shown in detail in FIG. 3, may preliminarily align the semiconductor substrate 10, which is transferred by the robot 180, on the basis of a flat zone or a notch of the semiconductor substrate 10. The pre-aligning unit 170 may include a rotary chuck 172 for holding and rotating the semiconductor substrate 10, a sensor 174 for sensing the flat zone or the notch and an alignment controller (not shown) for controlling operation of the rotary chuck 172 in accordance with a signal from the sensor 174.

The robot 180 for transferring the semiconductor substrate 10 may be arranged in a direction substantially perpendicular to the base plate 108. That is, the robot 180 may partially protrude in an upward direction from the base plate 108. The robot 180 may transfer the semiconductor substrate 10 to the pre-aligning unit 170. The robot 180 then transfers the pre-aligned semiconductor substrate 10 onto the stage 110. After inspection of the leakage current characteristic of the dielectric layer 30 is completed, the robot 180 then transfers the semiconductor substrate into the vessel 50.

Figure 4:
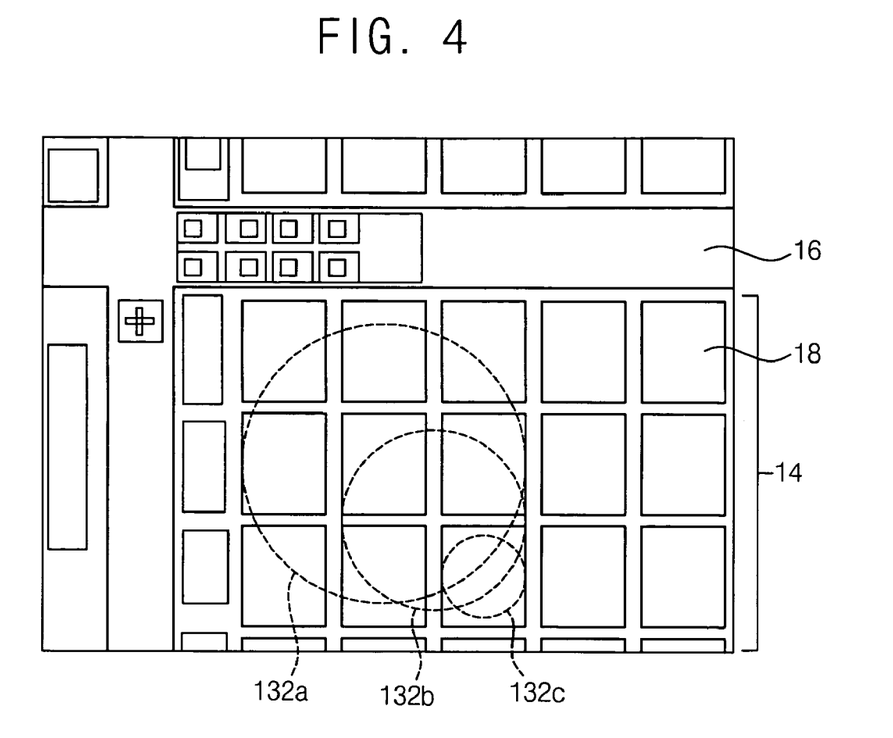
FIG. 4 illustrates an enlarged plan view of a cell block of a semiconductor substrate to be inspected.
Figure 5:
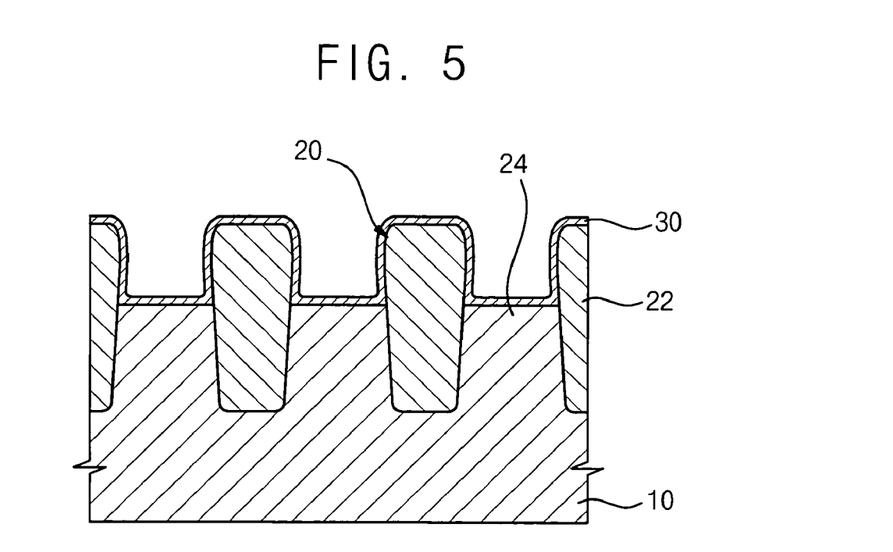
FIG. 5 illustrates a cross sectional view of a dielectric layer on the cell block in FIG. 4.

FIG. 4 illustrates an enlarged plan view of a cell block of a semiconductor substrate to be inspected, and FIG. 5 illustrates a cross sectional view of a dielectric layer on the cell block in FIG. 4. As shown in FIG. 3, a plurality of dies 12 is formed on the semiconductor substrate 10. Each of the dies 12, shown in detail in FIG. 4, includes a plurality of cell array regions 14 and a peripheral region 16. Each of the cell array regions 14 includes cell blocks 18 arranged in a matrix.

As shown in FIG. 5, a patterned structure 20 is on each of the cell blocks 18. A dielectric layer 30 is on the patterned structure 20. The patterned structure 20 may include protruded field insulation patterns 22 and active patterns 24. The dielectric layer 30 is on the field insulation patterns 22 and the active patterns 24. The field insulation patterns 22 may protrude upward from a surface of the active patterns 24. Alternatively, the field insulation patterns 22 and the active patterns 24 may have an even surface.

During inspection, a positive or negative corona ion charge generated from the corona emitter 124 is deposited on the cell block 18 selected from all of the cell blocks of the semiconductor substrate 10, which is aligned under the corona charger 120, through the corona-defining ring 128. The driving unit 112 moves the stage 110 to align the selected cell block 18 under the corona charger 120. While the corona ion charge is deposited on the dielectric layer 30 of the selected cell block 18, the corona-defining ring 128 is positioned over the dielectric layer 30, e.g., by a height of about 10 mils from the dielectric layer 30. A diameter of the corona-defining ring 128 may be matched to a size of each of the cell blocks 18.

In the particular example shown in FIGS. 2 and 3, and as superimposed on FIG. 4, the first probe 132a has a first size, the second probe 132b has a second size smaller than the first size, and the third probe 132c has a third size smaller than the second size. The third probe 132c may include a pick-up plate 140c having a diameter of about 10 µm to about 100 µm to measure the leakage current characteristic of the dielectric layer 30 on each of the cell blocks 18 in the cell array region 14. The size of the first probe 132c may vary in accordance with a width of each of the cell blocks 18.

Particularly, the pick-up plate 140c may have a diameter corresponding to the width of the cell block 18. Also, the sizes of the first and second probes 132a and 132b may vary in accordance with numbers of the cell blocks 18 to be measured. For example, the first probe 132a may include a pick-up plate having a diameter of about 2 mm and the second probe 132b may include a pick-up plate having a diameter of about 1 mm.

To measure the leakage current characteristic of the dielectric layer 30 on each of the cell blocks 18, the third probe 132c is selected. If the leakage current characteristic of the dielectric layer 30 of a region or number of cell blocks 18 is to be measured, the first probe 132a or the second probe 132b may be selected in accordance with a size thereof.

Alternatively, the sizes of the probes 132a–c may be determined in accordance with the sizes of each of the cell blocks 18. Since the size of the cell block 18 varies in accordance with a type of semiconductor devices, e.g., a 256 Mb-DRAM, a 512 Mb-DRAM, a 1 Gb-DRAM, a flash memory, etc., the sizes of each of the probes 132a–c may vary in accordance with a size of the cell block in each of the semiconductor devices. For example, the first, second and third probes 132a, 132b and 132c may have sizes corresponding to those of the cell blocks in the 256 Mb-DRAM, 512 Mb-DRAM, 1 Gb-DRAM, respectively.

Additionally, the first, second and third probes 132a, 132b and 132c may include pick-up plates matched to a shape corresponding to that of each of the cell blocks or to that of adjacent cell blocks 18 to be inspected. For example, the third probe 132c may include a rectangular pick-up plate (not shown) having a shape and a size corresponding to that of each of the cell blocks 18. The second probe 132b may include a rectangular pick-up plate (not shown) having a shape and a size corresponding to that of four adjacent cell blocks 18. The first probe 132a may include a rectangular pick-up plate (not shown) having a shape and a size corresponding to that of nine adjacent cell blocks 18.

When the variance of the surface voltage caused by the leakage current through the dielectric layer 30 on the cell block 18 is measured using the third probe 132c, the third probe 132c is spaced apart from the surface of the dielectric layer 30, e.g., by a height of about 5 mils. Vibration of the pick-up plate 140c corresponding to the third probe 132c with respect to the surface of the dielectric layer 30 induces a time-varying current on a surface of the pick-up plate 140c. The time-varying current is proportional to a potential difference between the pick-up plate 140c and the dielectric layer 30. The time-varying current generates a voltage substantially similar to a surface voltage potential on the dielectric layer 30 with respect to the semiconductor substrate 10.

The third probe 132c, the vibrator 138c and the rotary driver 136 are connected to the probe controller 142 via a signal line. The probe controller 142 selects any one among the probes 132a–c in accordance with the size of the region to be measured. The probe controller 142 controls operation of the rotary driver 136 to locate a selected probe, here the third probe 132c, at a position adjacent to the corona charger 120. The probe controller 142 also adjusts a vibration frequency of the selected probe. The time-varying current varies in accordance with the leakage current through the dielectric layer 30. The probe controller 142 measures a change of the surface voltage in accordance with a change of the time-varying current. The measured surface voltage of the dielectric layer 30 is gradually decreased by the leakage current through the dielectric layer 30 proportional to a lapse of time.

The driving unit 112 may move the stage 110 to align the selected cell block 18 under the corona charger 120 or the selected probe 132a–c based on the obtained image data.

Alternatively, the apparatus 100 may include a corona-charging unit (not shown) having elements substantially similar to those of the probe unit 130. In particular, the corona-charging unit may include a second circular disk, a second rotary driver for rotating the second circular disk, and a plurality of corona chargers mounted beneath the second circular disk. The corona chargers may include corona-defining rings having inner diameters different from each other. The corona-defining rings may be used in accordance with the sizes of regions to be inspected, e.g., each of the cell blocks 18.

The data-processing unit 160 compares the measured variance of the surface voltage with reference data to determine the leakage current characteristic of the dielectric layer 30. The data-input unit 162 inputs the corona ion charge to be deposited on the cell block 18, positions of the cell blocks 18 to be measured, sizes of each of the cell blocks 18, etc., into the data-processing unit 160. The data-output unit 164 outputs the reference data, the measured variance of the surface voltage, the determined current leakage characteristic of the dielectric layer 30, etc. The data-output unit 164 may be any conventional device, e.g., a monitor, a printer, a plotter, etc. The reference data, the measured variance of the surface voltage, the determined current leakage characteristic of the dielectric layer 30, etc., may be stored in the data-storing unit 166.

Figure 6:
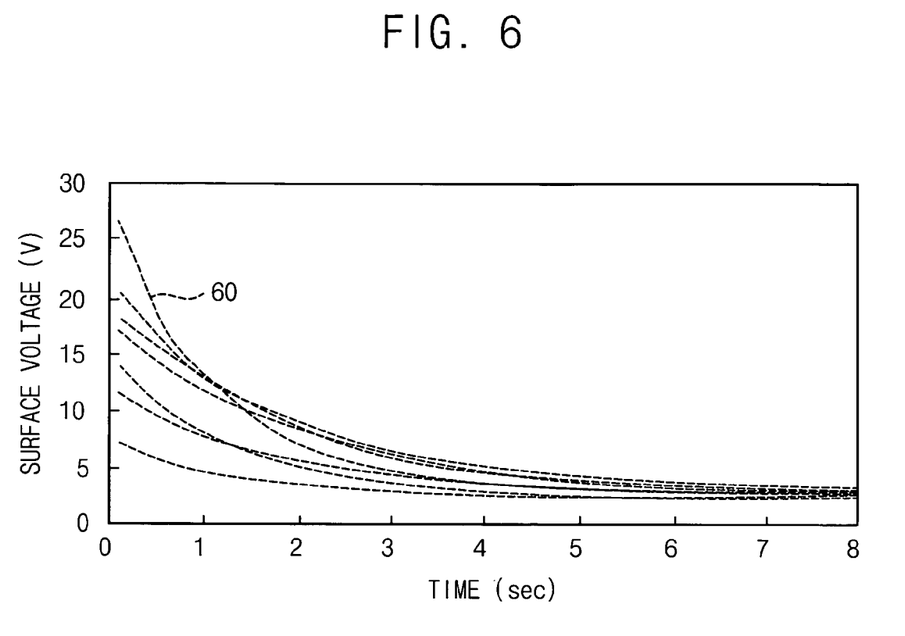
FIG. 6 is a graph of reference spectra.
Figure 7:
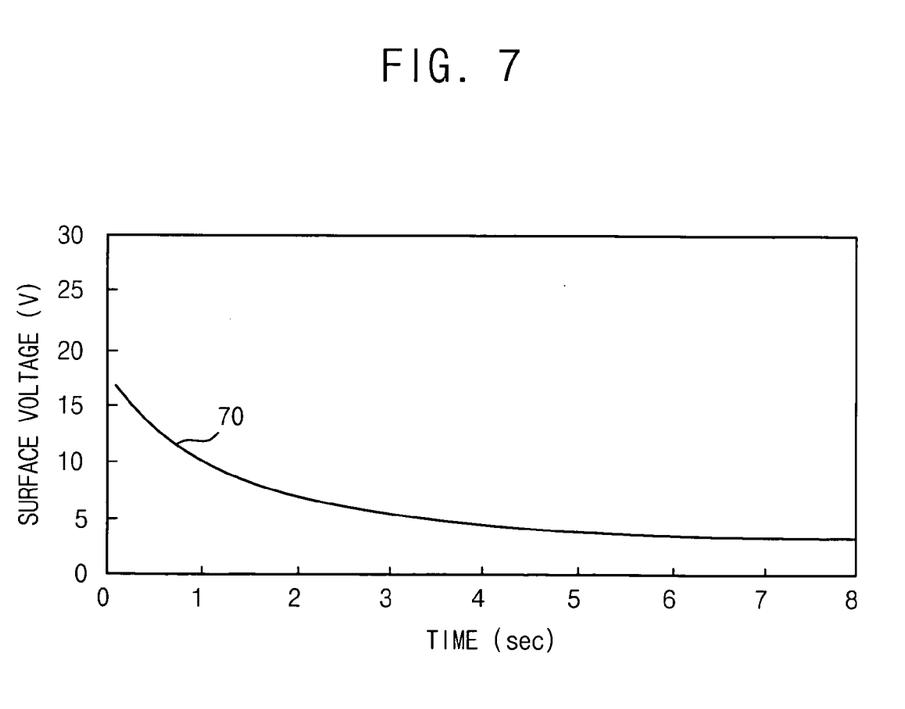
FIG. 7 is a graph of a measurement spectrum.

FIG. 6 is a graph of reference spectra and FIG. 7 is a graph illustrating a measurement spectrum.

Referring to FIGS. 6 and 7, the reference data includes a plurality of reference spectra 60 that represent variances of reference surface voltages previously obtained from a plurality of reference dielectric layers. The data-processing unit 160 plots the measured variance of the surface voltage output from the probe unit 130 to obtain a measurement spectrum 70. The data-processing unit 160 compares the measurement spectrum 70 with the reference spectra 60 to determine the leakage current characteristic of the dielectric layer 30 of the selected cell block 18. That is, the leakage current characteristic of the dielectric layer 30 is determined using a reference spectrum selected from all of the reference spectra 60 substantially similar to the measurement spectrum 70.

The reference spectra 60 may be experimentally obtained. For example, reference dielectric layers that include impurities having concentrations different from each other and step coverage characteristics different from each other may be provided. The variances of the reference surface voltages on the reference dielectric layers are measured to obtain the reference spectra 60.

Alternatively, the reference spectra 60 may be theoretically obtained. Theoretical variances of the surface voltages on the reference dielectric layers may vary in accordance with areas of the patterned structure on the cell block 18. For example, the variances of the surface voltages on the dielectric layer 30 on the cell block 18 arise due to more current leakage through a portion of the dielectric layer 30 on the active pattern 24 than through a portion of the dielectric layer 30 on the field insulation pattern 22. Also, the surface voltage of the dielectric layer 30 may vary in accordance with a theoretical leakage current characteristic, e.g., concentrations of contaminants, a thickness of the reference dielectric layer, a step coverage characteristic, a dielectric constant of the reference dielectric layer, etc. Thus, the variance of the surface voltage on the dielectric layer 30 formed on the cell block 18 may be represented as a function of time including the above-mentioned variables.

Figure 8:
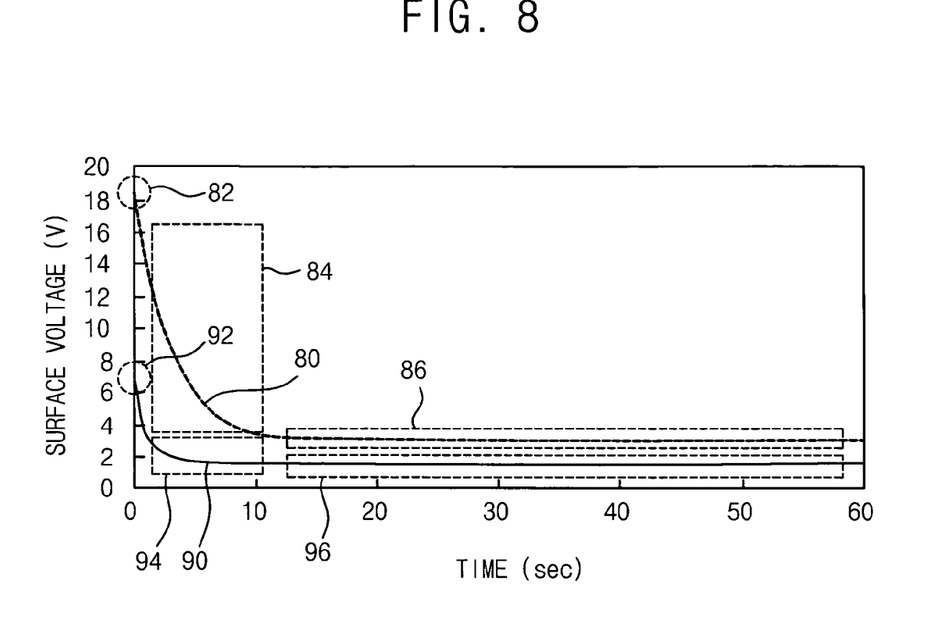
FIG. 8 is a graph of a reference spectrum and a measurement spectrum.

Alternatively, the reference data may include a reference spectrum representing a variance of a reference surface voltage previously obtained from the reference dielectric layer having normal characteristics, e.g., concentrations of contaminants, a thickness, a step coverage, etc., is formed on the cell block of the reference substrate. FIG. 8 is a graph illustrating such a reference spectrum and a measurement spectrum, and various ways of comparing the spectra.

The data-processing unit 160 may compare a measurement spectrum 90 indicating the measured variance of the surface voltage with the reference spectrum 80 to determine the leakage current characteristic of the dielectric layer 30 on the selected cell block 18.

Alternatively, the data-processing unit 160 may compare an initial voltage 92 obtained from the measurement spectrum 90 with an initial reference voltage 82 obtained from the reference spectrum 80 to determine the leakage current characteristic of the dielectric layer 30.

Also, the data-processing unit 160 may compare a voltage drop rate 94 obtained from the measurement spectrum 90 with a voltage drop rate 84 obtained from the reference spectrum 80 to determine the leakage current characteristic of the dielectric layer 30.

Further, the data-processing unit 160 may compare a steady-state voltage 96 obtained from the measurement spectrum 90 with a steady-state voltage 86 obtained from the reference spectrum 80 to determine the current characteristic of the dielectric layer 30.

Figure 9:
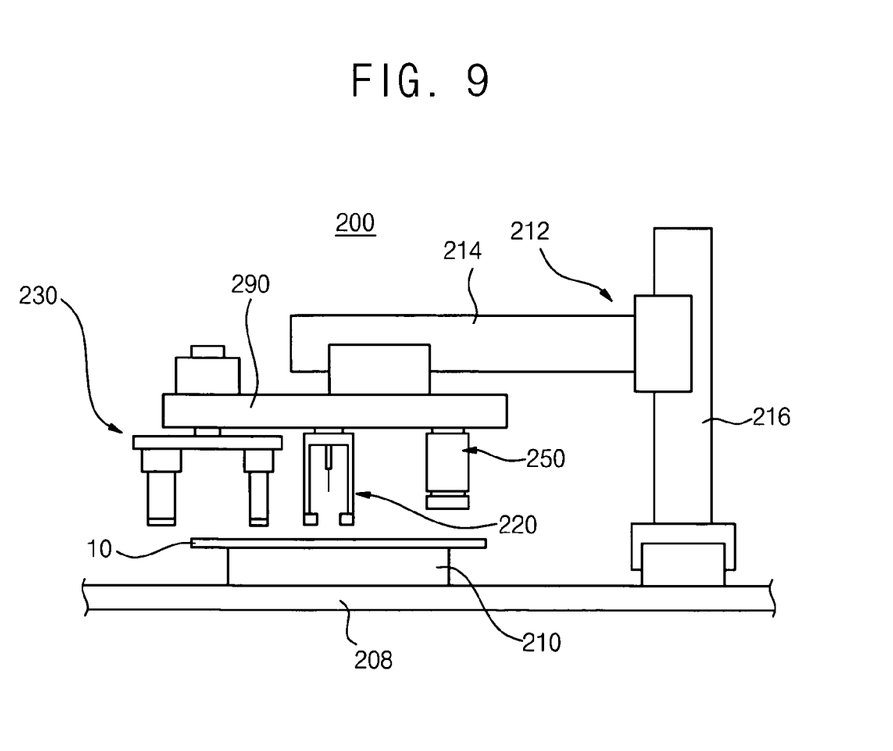
FIG. 9 illustrates a schematic view of a portion of an apparatus for inspecting a leakage current characteristic of a dielectric layer in accordance with another embodiment of the present invention.

FIG. 9 illustrates a schematic view of part of an apparatus for inspecting a leakage current characteristic of a dielectric layer in accordance with another embodiment of the present invention.

An apparatus 200 of this embodiment of the present invention includes elements substantially identical to those in the above-mentioned embodiment, differing only with respect to relative movement between a stage 210, a corona charger 220, a probe unit 230 and an image-obtaining unit 250. Thus, any further explanations concerning the substantially identical elements will be omitted.

The stage 210 is arranged on a base plate 208 in an inspection chamber (not shown). The stage 210 holds the semiconductor substrate 10 using vacuum. In this embodiment, the stage 210 is stationary.

A supporter 290 supports the corona charger 220, the probe unit 230 and the image-obtaining unit 250. The supporter 290 is mounted at a horizontal arm 214 of a driving unit 212. A driving controller (not shown) controls the driving unit 212. The driving unit 212 moves the supporter 290 in vertical and horizontal directions to align the probe unit 230 on a cell block selected from a plurality of cell blocks. An example of the driving unit 212 is a perpendicular coordinate type robot that has three axes.

Figure 10:
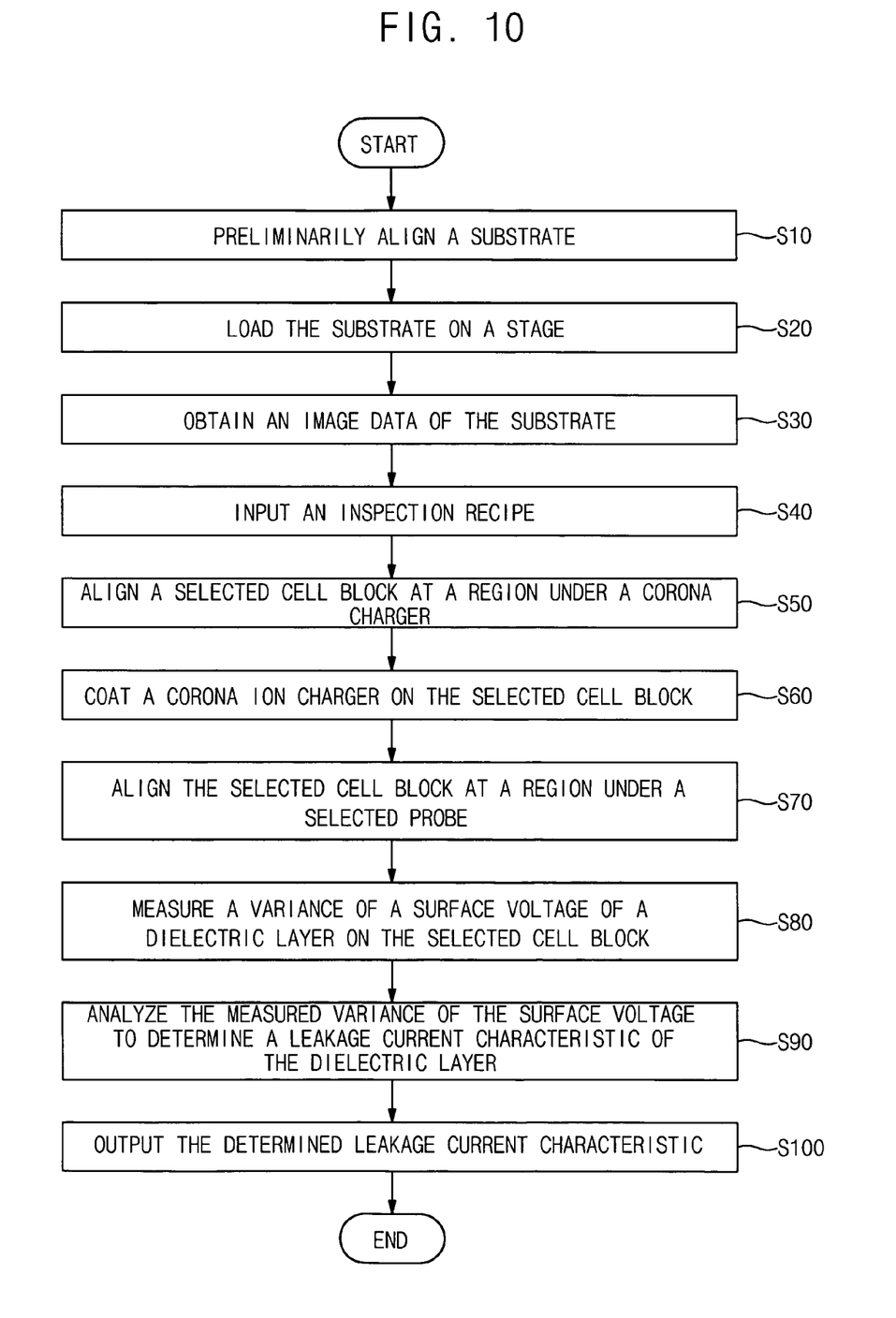
FIG. 10 is a flow chart illustrating a method of inspecting a leakage current characteristic of a dielectric layer in accordance with the present invention.

FIG. 10 illustrates a flow chart of a method of inspecting a leakage current characteristic of a dielectric layer. The steps of FIG. 10 will be discussed with reference to the apparatus of FIG. 1, although it is not limited thereto.

Referring to FIG. 10, in step S10, the semiconductor substrate 10 is transferred to the pre-aligning unit 170 from the vessel 50. The pre-aligning unit 170 preliminarily aligns the semiconductor substrate 10 on the basis of the notch of the semiconductor substrate 10. Here, the robot 180 transfers the semiconductor substrate 10 onto the rotary chuck 172 in the pre-aligning unit 170. The semiconductor substrate 10 on the rotary chuck 172 is preliminarily aligned in accordance with a signal from the edge sensor 174.

In step S20, the preliminarily aligned semiconductor substrate 10 is loaded onto the stage 110. The semiconductor substrate 10 is held on the stage, e.g., using the vacuum to electrically connect the ground potential.

In step S30, image data of the semiconductor substrate 10 on the stage 110 is obtained. Here, the driving controller 118 controls the operations of the driving unit 112 to position the semiconductor substrate 10 on the stage at a region under the image-obtaining unit 150. The image-obtainer 152 obtains the image of the semiconductor substrate 10. The image processor 154 processes the image to create the image data. The image processor 154 transfers the image data into the data-processing unit 160.

In step S40, an inspection recipe is input into the data-processing unit 160 by the data-input unit 162. The inspection recipe may include the corona ion charge to be deposited on the cell blocks 18, positions of the cell blocks 18 to be measured, the sizes of each of the cell blocks 18, etc.

In step S50, a selected cell block 18 is aligned under the corona charger 120. The driving unit 112 moves the stage 110 to align the corona charger 120 on the selected cell block 18. The data-processing unit 160 selects any one among the cell blocks 18 in the cell array region 14 of the semiconductor substrate 10. The data-processing unit 160 transfers data of the selected cell block 18 and the image data into the driving controller 118. The driving controller 118 aligns the selected cell block 18 at a region under the corona charger 120 in accordance with the data of the cell block 18 and the image data provided from the data-processing unit 160. Also, the driving controller 118 may adjust a gap between the corona charger 120 and the selected cell block 18.

Alternatively, the data-processing unit may select a plurality of cell blocks 18 arranged adjacent to each other in accordance with the inspection recipe. For example, four adjacent cell blocks 18 may be selected. Also, when the corona-charging unit is employed, any one among a plurality of corona chargers may be used in accordance with the size of the region to be measured.

In step S60, the corona ion charge is deposited on the selected cell block 18. The corona controller 129 controls the operation of the corona charger 120 to deposit the corona ion charge on the selected cell block 18 in accordance with the inspection recipe provided from the data-processing unit 160. In particular, the corona controller 129 controls the operation of the power supply 122 connected to the corona emitter 124 to control an amount of the corona ion charge on the selected cell block 18.

The probe controller 142 selects any one among the probes 132 in accordance with the size of the selected cell block 18. In step S70, the selected cell block 18 is aligned at a region under the selected third probe 132c. The probe controller 142 also controls the operation of the rotary driver 136 to locate the selected third probe 132c at a region adjacent to the corona charger 120. The driving controller 118 controls the operations of the driving unit 112 to align the third probe 132c on the selected cell block 18 based on the image data provided from the data-processing unit 160.

In step S80, the variance of the surface voltage of the dielectric layer 30 on the selected cell block 18 is measured for a predetermined time. The probe controller 142, electrically connected to the third probe 132c, measures the variance of the surface voltage caused by the leakage current through the dielectric layer 30 on the selected cell block 18. In particular, the probe controller 142 controls the vibration frequency of the third probe 132c. Also, the probe controller 142 converts the measured time-varying current into the surface voltage to obtain the variance of the surface voltage of the dielectric layer 30. The measured variance of the surface voltage is transferred into the data-processing unit 160.

In step S90, the measured variance of the surface voltage is analyzed to determine the leakage current characteristic of the dielectric layer 30. The data-processing unit 160 obtains the measurement spectrum from the measured variance of the surface voltage provided from the probe controller 142. The data-processing unit 160 compares the measurement spectrum with the reference data provided from the data-storing unit 166 to determine the leakage current characteristic of the dielectric layer 30 on the selected cell block 18.

For example, the reference data may include the reference spectra 60 previously obtained from the reference dielectric layers having the leakage current characteristics different from each other. The data-processing unit 160 may compare the measurement spectrum 70 with the reference spectra 60 to determine the leakage current characteristic of the dielectric layer 30. Particularly, the data-processing unit 160 may select a reference spectrum among the reference spectra 60 most similar to the measurement spectrum 70. The data-processing unit 160 determines the leakage current characteristic of the dielectric layer 30 on the selected cell block 18 based on the leakage current characteristic of the selected reference spectrum.

Alternatively, the reference data may include the reference spectrum 80 representing the variance of the reference surface voltage obtained from the reference dielectric layer. The data-processing unit 160 may compare the measurement spectrum 90 representing the measured variance of the surface voltage with the reference spectrum 80 to determine the leakage current characteristic of the dielectric layer 30 on the selected cell block 18.

Also, the reference spectrum 80 may be obtained from the reference dielectric layer formed on the reference semiconductor substrate. In particular, the data-processing unit 160 may compare the initial measurement voltage 92 obtained from the measurement spectrum 90 with the initial reference voltage 82 obtained from the reference spectrum 80 to determine the leakage current characteristic of the dielectric layer 30.

Further, the data-processing unit 160 may compare the measurement voltage drop rate obtained from the measurement spectrum 90 with the reference voltage drop rate obtained from the reference spectrum 80 to determine the leakage current characteristic of the dielectric layer 30.

Still further, the data-processing unit 160 may compare the steady-state voltage obtained from the measurement spectrum 90 with the steady-state voltage obtained from the reference spectrum 80 to determine the leakage current characteristic of the dielectric layer 30.

In step S100, the determined leakage current characteristic of the dielectric layer 30 is output through the data-output unit 164. Also, the measurement spectra 70 and 90 and the reference spectra 60 and 80, respectively, may be output together with the determined leakage current characteristic of the dielectric layer 30 through the data-outputting unit 164. For example, the leakage current characteristic of the dielectric layer 30 and the spectra 60, 70, 80 and 90 may be displayed on a monitor or printed by a printer. The leakage current characteristic of the dielectric layer 30, the measured variance of the surface voltage and the measurement spectra 70 and 90 are stored in the data-storing unit 166.

The inspection of the leakage current characteristic of the dielectric layer 30 may be repeatedly performed on other cell blocks 18 in the cell array region 14. After the inspection is completed, the semiconductor substrate 10 is then unloaded from the stage 110.

The dielectric layer 30 in FIG. 5 may be for a tunnel oxide layer of a flash memory device. The method and the apparatus in accordance with the present invention may be employed in inspecting a leakage current characteristic of other dielectric layers such as a gate oxide layer of a transistor, a dielectric layer of a capacitor, a dielectric layer of a flash memory, etc. Thus, the scope of the present invention is not restricted to a particular type of dielectric layer.

According to the present invention, the leakage current characteristic of the dielectric layer on each of the cell blocks or adjacent cell blocks in the cell array region of the semiconductor substrate is separately obtained. Thus, the leakage current characteristic of the dielectric layer obtained using the present invention may be managed practically and accurately compared to the conventional method.

Also, the measurement data is compared with the reference data, so that the inspection of the leakage current characteristic may have improved reliability. Further, since the inspection of the leakage current characteristic is performed on the semiconductor substrate having the patterned structure in manufacturing the semiconductor device, detailed and practical data with respect to the leakage current characteristic of the dielectric layer may be obtained.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for inspecting a leakage current characteristic of a dielectric layer on a substrate having a cell array region that includes a patterned structure, a plurality of cell blocks on the patterned structure and a peripheral circuit region, the apparatus comprising:
   a corona charger adapted to deposit a corona ion charge on a cell block selected from among a plurality of cell blocks;
   a probe unit for measuring a variance of a surface voltage caused by a leakage current through the dielectric layer on the selected cell block, the probe unit including a plurality of probes having different sizes; and
   a data-processing unit for comparing the measured variance of the surface voltage with reference data and determining the leakage current characteristic of the dielectric layer.

2. The apparatus as claimed in claim 1, wherein the probe unit comprises a plurality of probes having different sizes.

3. The apparatus as claimed in claim 1, further comprising:
   an image-obtaining unit for obtaining an image of the substrate;
   a stage adapted to support the substrate;
   a driving unit for moving the stage, the corona charger and the probe unit relative to one another; and
   a driving controller for controlling operations of the driving unit to align the selected cell block with a selected probe from the plurality of probes or the corona charger.

4. The apparatus as claimed in claim 3, wherein the selected probe comprises a pick-up plate having a diameter corresponding to a width of the selected cell block, and a vibrator for vibrating the pick-up plate.

5. The apparatus as claimed in claim 3, wherein the selected probe comprises a pick-up plate having a shape corresponding to that of the selected cell block, and a vibrator for vibrating the pick-up plate.

6. The apparatus as claimed in claim 1, wherein the probe unit further comprises a common support for supporting the plurality of probes.

7. The apparatus as claimed in claim 6, wherein the probes are arranged in a radial direction with respect to a center of the common support.

8. The apparatus as claimed in claim 6, further comprising a rotating supporter for the probe unit.

9. The apparatus as claimed in claim 8, further comprising a probe controller for selecting a probe having a size corresponding to a width of the selected cell block from the plurality of probes.

10. The apparatus as claimed in claim 1, further comprising:
    an image-obtaining unit for obtaining an image of the substrate;
    a driving unit; and
    a driving controller for selecting a selected probe from the plurality of probes having a size corresponding to a width of the selected cell block, and controlling operation of the driving unit to align the selected probe or the corona charger with the selected cell block.

11. The apparatus as claimed in claim 1, wherein the reference data comprises reference spectra representing variances of reference surface voltages obtained from different reference dielectric layers.

12. The apparatus as claimed in claim 11, wherein the data-processing unit comprises:
    a comparator for comparing the reference spectra with a measurement spectrum representing the measured variance of the surface voltage; and
    a calculator for calculating values of the leakage current characteristic of the dielectric layer in accordance with comparison results of the comparator.

13. The apparatus as claimed in claim 1, wherein the reference data comprises a reference spectrum representing a variance of a reference surface voltage obtained from a reference dielectric layer.

14. The apparatus as claimed in claim 13, wherein the data-processing unit comprises:
    a comparator for comparing an initial reference voltage of the reference spectrum with an initial measurement voltage of a measurement spectrum representing the measured variance of the surface voltage; and
    a calculator for calculating values of the leakage current characteristic of the dielectric layer in accordance with comparison results of the comparator.

15. The apparatus as claimed in claim 13, wherein the data-processing unit comprises:
    a comparator for comparing a voltage drop rate of the reference spectrum with a voltage drop rate of a measurement spectrum representing the measured variance of the surface voltage; and a calculator for calculating values of the leakage current characteristic of the dielectric layer in accordance with comparison results of the comparator.

16. The apparatus as claimed in claim 13, wherein the data-processing unit comprises:
   a comparator for comparing a steady-state voltage of the reference spectrum with a steady-state voltage of a measurement spectrum representing the measured variance of the surface voltage; and
   a calculator for calculating values of the leakage current characteristic of the dielectric layer in accordance with comparison results of the comparator.

17. The apparatus as claimed in claim 1, further comprising a pre-aligning unit for preliminarily aligning the substrate on the basis of a notch in the substrate.

* * * * *